US009110465B1

(12) United States Patent
Feng et al.

(10) Patent No.: US 9,110,465 B1
(45) Date of Patent: Aug. 18, 2015

(54) METHODS FOR PROVIDING ASYMMETRIC RUN TO RUN CONTROL OF PROCESS PARAMETERS

(75) Inventors: Jian-Huei Feng, San Jose, CA (US); Ming Jiang, San Jose, CA (US); Clayton R. Newman, Pleasanton, CA (US); Yeak-Chong Wong, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 1073 days.

(21) Appl. No.: 13/100,976

(22) Filed: May 4, 2011

(51) Int. Cl.
*G06F 19/00* (2011.01)
*G05B 19/418* (2006.01)

(52) U.S. Cl.
CPC *G05B 19/41875* (2013.01); *G05B 2219/45031* (2013.01)

(58) Field of Classification Search
USPC .................................................. 700/103, 121
See application file for complete search history.

(56) References Cited

U.S. PATENT DOCUMENTS

| 5,111,404 | A | 5/1992 | Kotani |
| 6,366,822 | B1 | 4/2002 | Heavlin |
| 6,708,073 | B1 | 3/2004 | Heavlin |
| 6,757,579 | B1 * | 6/2004 | Pasadyn ........................ 700/108 |
| 7,181,355 | B2 | 2/2007 | Kondo et al. |
| 7,269,526 | B2 * | 9/2007 | Muro et al. ..................... 702/84 |
| 7,542,880 | B2 * | 6/2009 | Good et al. .................... 702/194 |
| 7,809,459 | B2 | 10/2010 | Morisawa et al. |
| 7,914,657 | B2 * | 3/2011 | Fu et al. ........................... 205/84 |
| 8,028,061 | B2 * | 9/2011 | Battisha et al. ............... 709/224 |
| 8,180,417 | B2 * | 5/2012 | Kim et al. .................. 455/575.4 |
| 8,224,475 | B2 * | 7/2012 | Tsai et al. ...................... 700/121 |
| 8,437,870 | B2 * | 5/2013 | Tsai et al. ..................... 700/110 |
| 8,688,256 | B2 * | 4/2014 | Cheng et al. .................. 700/121 |
| 2007/0021263 | A1 * | 1/2007 | Moore et al. .................. 475/220 |
| 2007/0145010 | A1 * | 6/2007 | Lee et al. ........................ 216/84 |
| 2008/0221831 | A1 | 9/2008 | Wang |
| 2008/0299681 | A1 * | 12/2008 | Jaeger et al. ...................... 438/8 |
| 2009/0018687 | A1 | 1/2009 | Ishibashi et al. |
| 2009/0171638 | A1 * | 7/2009 | Morisawa et al. ................ 703/7 |

OTHER PUBLICATIONS

Park et al, "Economic design of a variable sampling rate EWMA chart", 2004, pp. 387-399.*
Moyne et al, "Run to Run control in Semoconductor Manufacturing chapters 18-19", 2000, pp. 31.*

(Continued)

*Primary Examiner* — Sean Shechtman
*Assistant Examiner* — Olvin Lopez Alvarez

(57) ABSTRACT

Methods for providing asymmetric control of process parameters are described. One such method includes receiving a data point for the process parameter relative to the wafer, selecting a first value for a process weighting factor when the data point is consistent with a first criteria, selecting a second value for the process weighting factor when the data point is consistent with a second criteria, where the second value is not equal to the first value, calculating an exponential weighted moving average of the process parameter based on the data point and the process weighting factor, updating the process parameter with the exponential weighted moving average, and using the updated process parameter to control the process and thereby treat the wafer. The methods can use one or more weighting factor switch limits to define different areas of risk associated with a target for the process parameter.

14 Claims, 3 Drawing Sheets

(56) References Cited

OTHER PUBLICATIONS

Butler et al, "Supervisory Run-to-Run Control of Poly silicon Gate Etch Using in Situ Ellipsometry", IEEE May 1994, pp. 193-201.*
Chen et al "Age-Based Double EWMA Controller and Its Application to CMP Processes", IEEE Feb. 2001, pp. 11-19.*
Aparisi et al, "Design and optimization of EWMA control charts for in-control, indifference, and out-of-control regions", Sep. 2005, pp. 2096-2108.*
Fan et al, "EWMA/SD : an End-Of-Line SPC Scheme to Monitor Sequence-Disordered Data", IEEE 1997, pp. 66-69.*
Hunter, "The Exponentially Weighted Moving Average" Oct. 1986, pp. 203-210.*
Lucas et al, "Exponentially Weighted Moving Average Control Schemes: Properties and Enhancemnets", Feb. 1990, pp. 1-12.*
NIST/SemaTech, "e-Handbook of Statistical Methods", 1991, http://www.itl.nist.gov/div898/handbook/ pp. 18.*
Fan et al, "SISO run-to-run feedback controller using triple EWMA smoothing for semiconductor manufacturing processes", 2002, pp. 3093-3120.*
Smith et al, "A Self-Tuning EWMA Controller Utilizing Artificial Neural Network Function Approximation Techniques", Apr. 1997, pp. 121-132.*
Boning et al, "Run by Run Control of Chemical-Mechanical Polishing", Oct. 1996, pp. 307-314.*
S. Butler and J. Stefani, "Supervisory Run-to-Run Control of Polysilicon Gate Etch Using in Situ Ellipsometry," IEEE Trans. Semiconduct. Manufact., vol. 7, No. 2, pp. 193-201, 1994.
R. Guo, A. Chen, and J. Chen, "Chapter 19 An Enhanced EWMA Controller for Processes Subject to Random Disturbances," Run-to-Run Control in Semiconductor Manufacturing, edited by J. Moyne, E. del Castillo, and A. M. Hurwitz, CRC Press LLC, 2001.

* cited by examiner

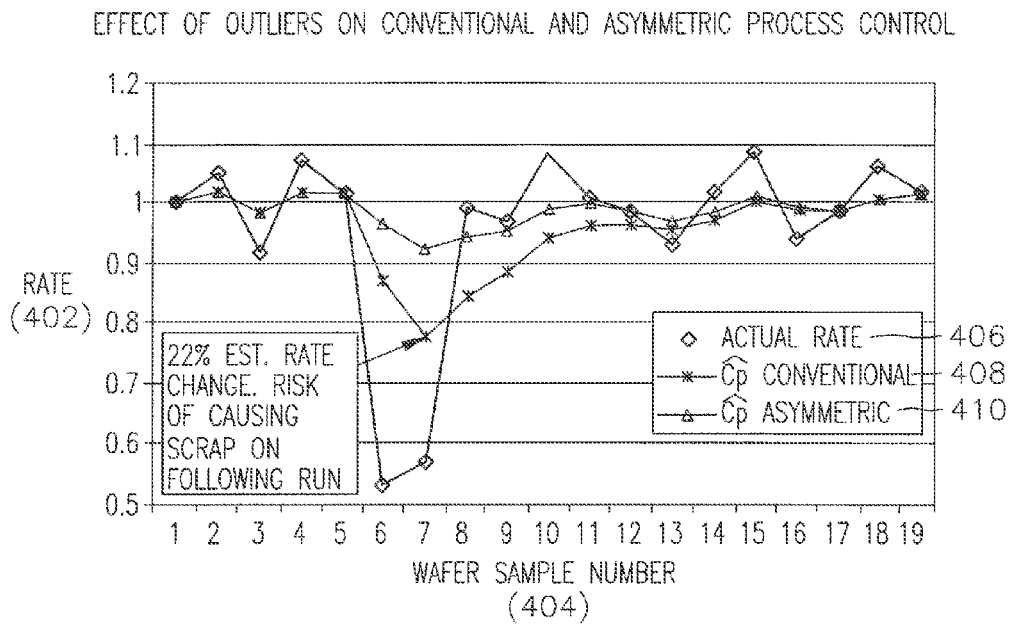
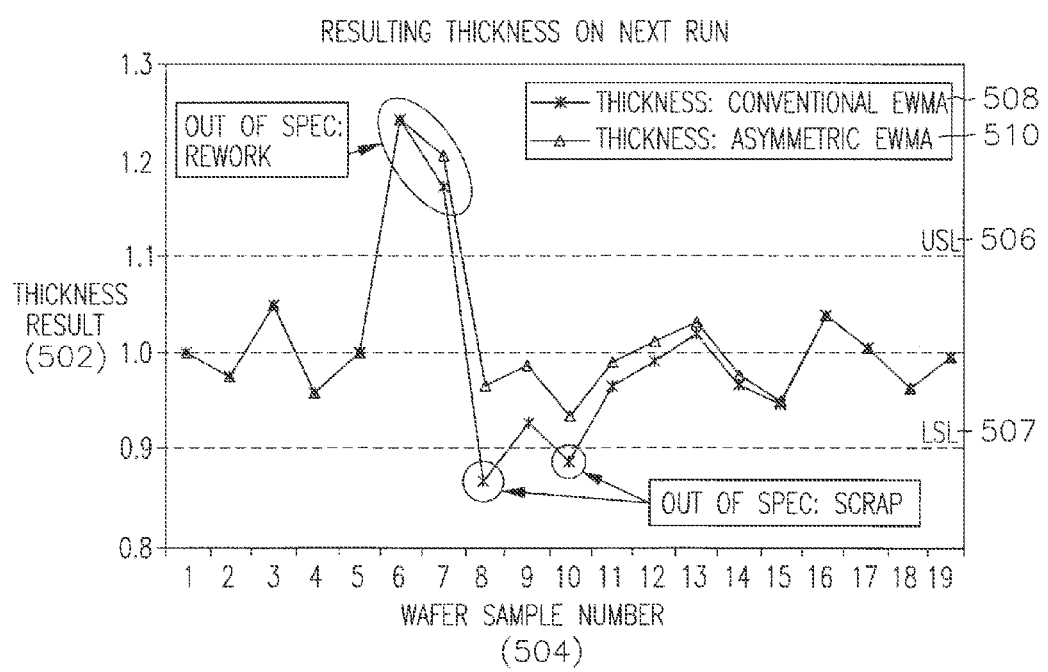

METHODS FOR PROVIDING ASYMMETRIC RUN TO RUN CONTROL OF PROCESS PARAMETERS

FIELD

The present invention relates to manufacturing processes, and more specifically to methods for providing asymmetric run to run control of process parameters.

BACKGROUND

Many manufacturing processes have specification limits, or process parameters, that can be more important to enforce in one direction than in the other, relative to the specification limit. For example, a material removal process such as ion milling or chemical mechanical planarization (CMP) on a wafer can have a specification limit/target related to wafer thickness. If not enough material is removed to meet the specification target thickness, the wafer can be reworked to remove additional material. However, if too much material is removed, the wafer may need to be scrapped, which is far more expensive than removing less material than necessary to meet the target thickness. In this case, it makes sense to err on the side of removing less than the target thickness. At the same time, there is generally a requirement to keep the process centered on the specification limit/target.

Processes employing exponential weighted moving average (EWMA) type filters have been used in conjunction with run to run type control to track and adjust the critical process parameters if they drift. However, these known processes do not adequately address the above described problem of asymmetric risk for a process parameter.

SUMMARY

Aspects of the invention relate to methods for providing asymmetric run to run control of process parameters. In one embodiment, the invention relates to a method for providing asymmetric control of a process parameter for treating a wafer, the method including receiving a data point for the process parameter relative to the wafer, selecting a first value for a process weighting factor when the data point is consistent with a first criteria, selecting a second value for the process weighting factor when the data point is consistent with a second criteria, where the second value is not equal to the first value, calculating an exponential weighted moving average of the process parameter based on the data point and the process weighting factor, updating the process parameter with the exponential weighted moving average, and using the updated process parameter to control the process and thereby treat the wafer.

In several embodiments, the methods use one or more weighting factor switch limits to define different areas of risk associated with a target for the process parameter. In one such embodiment, a weighting factor switch limit is used to define a high risk area, and correspondingly a low risk area. In such case, the weighting factor switch limit is also used to determine which of the first and second weighting factors will be applied for the next value of the process parameter.

BRIEF DESCRIPTION OF THE DRAWINGS

FIG. 4 is a graph illustrating process adjustments for a material removal rate over a number of wafer samples for a conventional process using no averaging, a conventional process using a basic exponential weighted moving average, and a process using an asymmetric exponential weighted moving average in accordance with one embodiment of the invention.

FIG. 5 is a graph illustrating a resulting thickness based on the process removal rates of FIG. 4 in accordance with one embodiment of the invention.

DETAILED DESCRIPTION

Figure 1:
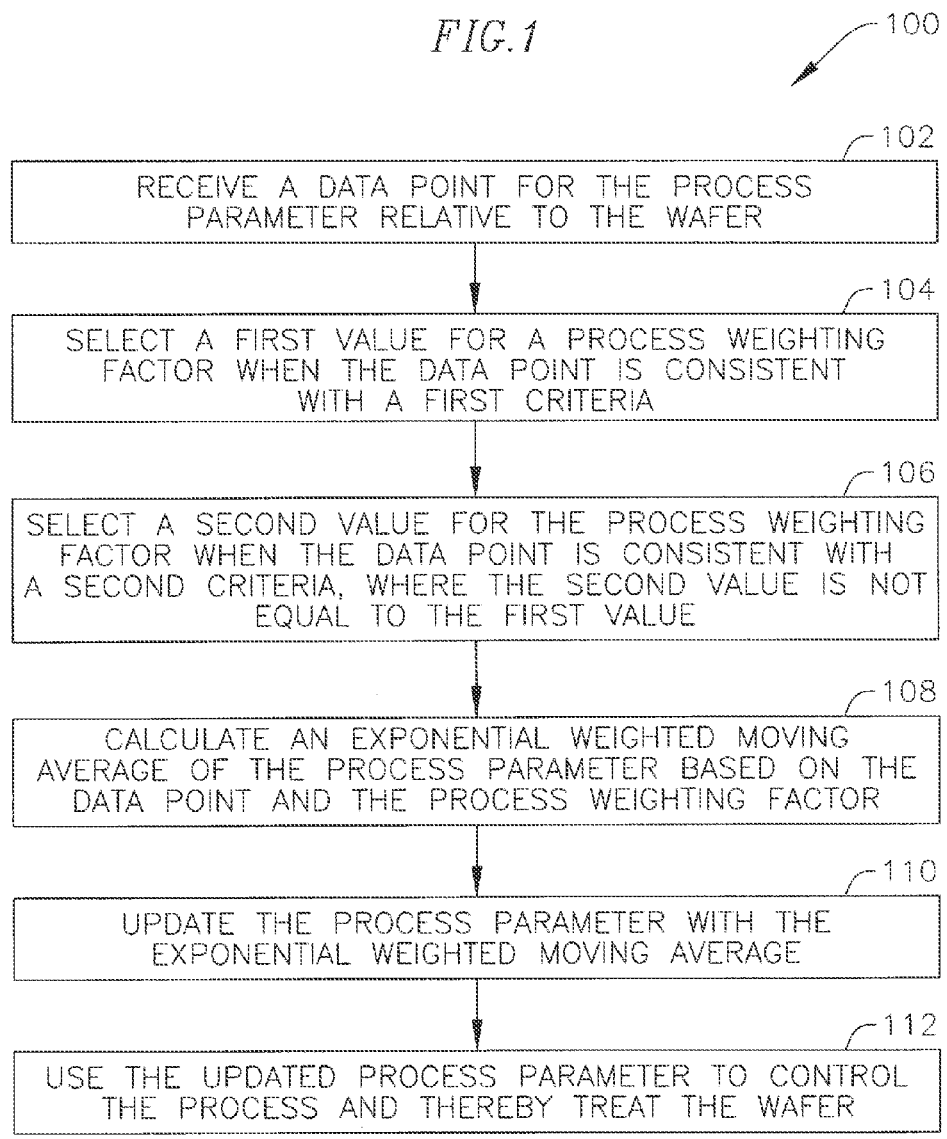
FIG. 1 is a flowchart of a process for providing asymmetric control of a process parameter in accordance with one embodiment of the invention.

Referring now to the drawings, embodiments of processes for providing asymmetric control of a process parameter and exemplary results thereof are illustrated. The processes apply an asymmetric exponential weighted moving average formula including a first weighting factor for data falling in an area above a process parameter target, and a second weighting factor for data falling in an area below the process parameter target. In such case, the processes can actively bias the output of the process toward either the area above the process target or the area below the process target, depending on which area represents a lower risk of an undesirable result.

In one embodiment, for example, the process target is a wafer thickness. In such case, if the process removes less wafer material than required to meet the wafer thickness target, the wafer can be reworked to meet the thickness target. As such, the area above the target, or above the target upper limit, represents a low risk area. If the process however removes more wafer material than required to meet the wafer thickness target, the wafer likely cannot be reworked and may therefore be unusable. As such, the area below the target, or below the target lower limit, represents a high risk area and a result falling within the high risk area represents an undesirable result.

In many embodiments, the processes use a weighting factor switch limit to define the high risk area, and correspondingly the low risk area. In such case, the weighting factor switch limit is also used to determine which of the weighting factors will be applied for the next value of the process parameter.

FIG. 1 is a flowchart of a process 100 for providing asymmetric control of a process parameter in accordance with one embodiment of the invention. The process first receives (102) a data point for the process parameter relative to the wafer (e.g., workpiece). In several embodiments, the data point is a new data point for the process parameter. The process then selects (104) a first value for a process weighting factor when the data point is consistent with a first criteria. In several embodiments, the first criteria includes comparing the location of the data point with a previously calculated process parameter average value scaled by a weighting factor switch limit. The weighting factor switch limit can act as a preselected boundary between a low risk area and a high risk area associated with a process limit or target for the process parameter.

The process then selects (106) a second value for the process weighting factor when the data point is consistent with a second criteria, where the second value is not equal to the first value. In a number of embodiments, the second criteria also includes comparing the location of the data point with the previously calculated process parameter average value scaled by the weighting factor switch limit. In several embodiments, the first criteria and second criteria are mutually exclusive.

The process then calculates (108) an exponential weighted moving average of the process parameter based on the data point and the process weighting factor. In several embodiments, the exponential weighted moving average is calculated using a formula including a known exponential weighted moving average that is modified by use of the first and second process weighting factors. The process then updates (110) the process parameter with the exponential weighted moving average. The process uses (112) the updated process parameter to control the process and thereby treat the wafer (e.g., workpiece).

In some embodiments, the process is a material removal process and the process parameter is a rate of material removal. In such case, the process limit or target can be a preselected thickness of a wafer or substrate to which the material removal process is applied. In one embodiment, the material removal process is an ion milling process or a chemical mechanical planarization (CMP) process. In some embodiments, the process is a deposition process and the process parameter is a rate of material deposition for the wafer. In other embodiments, the process can be another type of process where an asymmetric risk about a process limit/target exists.

In one embodiment, the process can perform the sequence of actions in a different order. In another embodiment, the process can skip one or more of the actions. In other embodiments, one or more of the actions are performed simultaneously. In some embodiments, additional actions can be performed.

Figure 2:
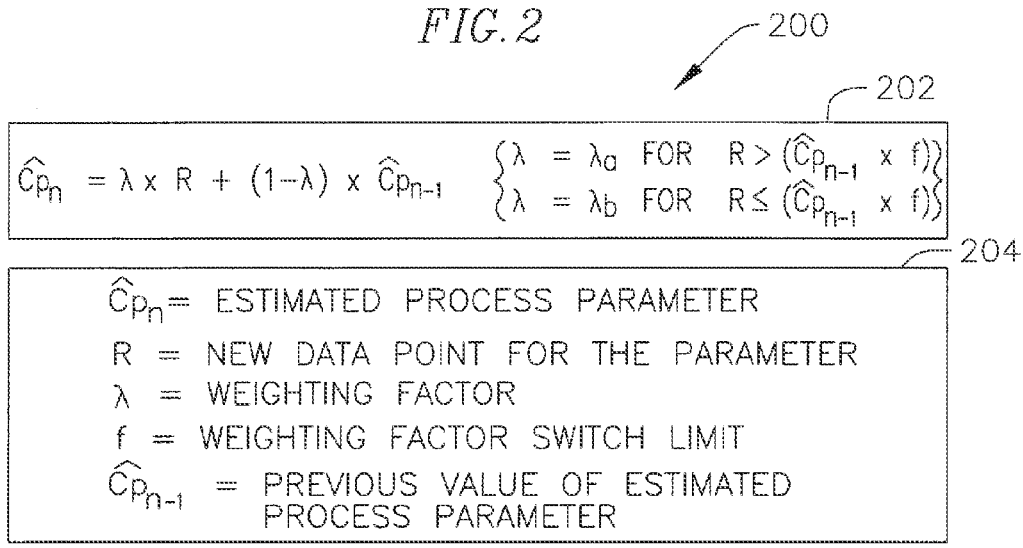
FIG. 2 is an illustration of an asymmetric exponential weighted moving average formula that can be used in a process for providing asymmetric control of a process parameter in accordance with one embodiment of the invention.

FIG. 2 is an illustration 200 of an asymmetric exponential weighted moving average formula 202 that can be used in a process for providing asymmetric control of a process parameter in accordance with one embodiment of the invention. In several embodiments, the formula 202 can be used in conjunction with the asymmetric control process of FIG. 1. The illustration 200 further includes a variable definition block 204 that includes definitions for each of the variables in the formula 202. While the expression in the formula 202 for the estimated process parameter (e.g., $Cpn=\lambda \times R+(1-\lambda) \times Cpn-1$) is a known formula for computing an exponential weighted moving average, the asymmetric expression of the exponential weighted moving average formula using different weighting factors (e.g., $\lambda a$ and $\lambda b$) is not believed to be known in the art.

In operation, the asymmetric exponential weighted moving average formula 202 can compare the value of a new data point (R) with a previous value of the estimated process average (Cpn−1) scaled by the weighting factor switch limit (f). If the new data point (R) is greater than the scaled previous value (Cpn−1), then the process can use the first weighting factor ($\lambda a$). In several embodiments, this comparison can correspond to the first criteria of the process described in FIG. 1. Alternatively, if the new data point (R) is less than, or equal to, the scaled previous value (Cpn−1), then the process can use the second weighting factor ($\lambda b$). In several embodiments, this comparison can correspond to the second criteria of the process described in FIG. 1.

In one embodiment, the first weighting factor ($\lambda a$) is 0.3 and the second weighting factor ($\lambda b$) is 0.1, thereby giving a lower weight to new data points that are below the weighting factor switch limit and a higher weight to new data points that are above the weighting factor switch limit. In one embodiment, each of the potential weighting factors is a value ranging from 0 up to 1. In one embodiment, the weight factor switch limit (f) is 0.8, thereby setting the value to 80% of the process parameter to be controlled. In such case, the process parameter can drift downward normally as long as the new estimated parameter is not too different from the current estimated rate, but if it is significantly low, then it is given much less weight. For these example weighting factors, as long as the new data point is not in the high risk zone, the process will use 30% of the new data and 70% of the previous estimated data to calculate the new estimate. When the new data is in the high risk zone (beyond the weight factor switch limit), the process will only use 10% of the new data and 90% of the previous estimated data to calculate the new estimate.

In several embodiments, the weighting factors and the weighting factor switch limits can have other suitable values. In several embodiments, the actual weighting factors and the weighting factor switch limits are chosen based on an amount of process drift and an amount of other variations in the process parameter to be controlled. In one embodiment, a simulation is performed that is similar to that of FIG. 4, discussed in further detail below, to determine suitable values for the weighting factors and the weighting factor switch limits. In such case, the values can be determined based on historical data and then adjusted to reduce instances of poor performance.

In one embodiment, the weight factor switch limit (f) is 1, thereby providing that there is no scaling of the previous average value (Cpn−1). In such case, the first and second weighting factors ($\lambda a$ and $\lambda b$) are applied depending only on the value of the new data point (R) as compared to the previous average value (Cpn−1).

In some embodiments, the process parameter may be associated with a process having multiple risk zones. In such case, the parameter control process can use a multi-zone adjustment technique including multiple weighting factor switch limits and more than two weighting factors. In one embodiment, for example, the control process can have two weighting factor switch limits ($f_H$ and $f_L$). In such case, the control process can have three weighting factors ($\lambda a$, $\lambda b$, and $\lambda c$) such that the weighting factor ($\lambda$) is determined as follows:

$\lambda=\lambda a$ for $R>f_H \times Cpn-1$, $\lambda=\lambda b$ for $f_H \times Cpn-1>=R>f_L \times Cpn-1$, and $\lambda=\lambda c$ for $R<=f_L \times Cpn-1$, In one such embodiment, $f_H$ is 1.1 and $f_L$ is 0.8. In other embodiments, the weighting factor switch limits can have other suitable values.

Figure 3:
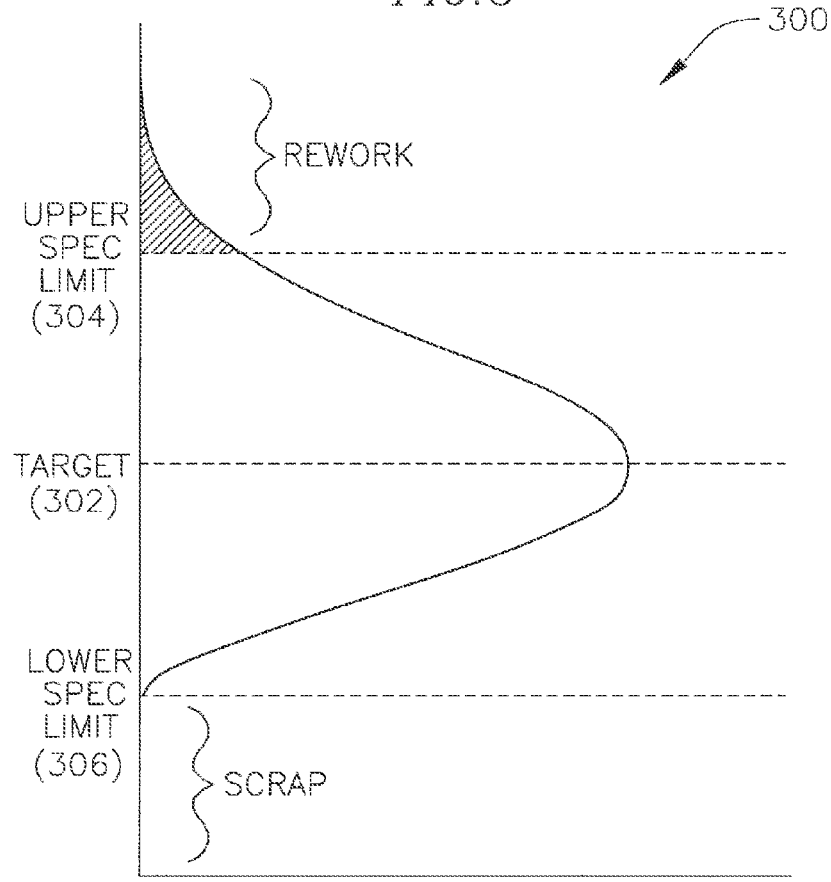
FIG. 3 is a graph of output distribution of an asymmetrically controlled material removal process, where the process is centered on a process output target while asymmetrically favoring an upper limit over a lower limit in accordance with one embodiment of the invention.

FIG. 3 is a graph of output distribution 300 of an asymmetrically controlled material removal process, where the process is centered on a process output target 302 while asymmetrically favoring an upper limit 304 over a lower limit 306 in accordance with one embodiment of the invention. By asymmetrically favoring data in a low risk area above the target, some of the process workpieces (e.g., wafers) may not fall within the upper specification limit 304 (see e.g., the hatched area above upper specification limit 304). However, those wafers can be reworked to meet the upper specification limit 304. At the same time, the asymmetric process depicted in FIG. 3 substantially avoids thicknesses of the resulting wafers falling below the lower specification limit 306 and scrapping those wafers.

FIG. 4 is a graph 400 illustrating process adjustments for a material removal rate 402 over a number of wafer samples 404 for a conventional process using no averaging 406, a conventional process using a basic exponential weighted moving average 408, and a process using an asymmetric exponential weighted moving average 410 in accordance with one embodiment of the invention. As can be seen in FIG. 4, the asymmetric process 410 appears to operate with the most consistent removal rate despite relatively drastic changes in the actual rate 406. At the same time, because the conventional process using basic averaging 408 has a substantial reduction in rate shortly after the sixth sample wafer and then ramps back up fairly quickly, there is some risk of causing scrap wafers on following runs for the conventional process 408. More specifically, for the conventional process 408, the two low rate runs have pulled the rate estimation down by 22%. This could cause too much removal on the next run(s) with a risk of scrapping the part. For the asymmetric process 410, the estimate is only pulled down 8%, so the risk of scrap on the next runs is minimal.

FIG. 5 is a graph 500 illustrating a resulting thickness 502 based on the process removal rates of FIG. 4 in accordance with one embodiment of the invention. The graph 500 illustrates the resulting thickness 502 on the vertical axis and the number of sample wafers 504 on the horizontal axis. The graph 500 also illustrates the upper limit 506, lower limit 507, thickness for runs of the conventional process 508 and thickness for runs of the asymmetric process 510. As can be seen from the graph 500, both processes result in two wafers having a thickness being above the upper limit 506, which can be reworked. However, only the conventional process 508 results in two wafers having a thickness being below the lower limit 507 (e.g., scrap wafers).

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A method for providing asymmetric control of a process parameter of a process for treating a wafer, the method comprising:
receiving a data point for the process parameter relative to the wafer;
selecting a first value for a process weighting factor when the data point is consistent with a first criteria;
selecting a second value for the process weighting factor when the data point is consistent with a second criteria, wherein the second value is not equal to the first value;
calculating an exponential weighted moving average of the process parameter based on the data point and the process weighting factor;
updating the process parameter with the exponential weighted moving average; and
using the updated process parameter to control the process and thereby treat the wafer,
wherein the first criteria is a function of the data point, a previously calculated process parameter value and a first weighting factor switch limit, and
wherein the first criteria is mutually exclusive of the second criteria.

2. The method of claim 1, wherein the second criteria is a function of the data point, the previously calculated process parameter value and the first weighting factor switch limit.

3. The method of claim 1, wherein the first criteria corresponds to whether the data point is greater than the previously calculated process parameter value multiplied by the first weighting factor switch limit.

4. The method of claim 3, wherein the second criteria corresponds to whether the data point is less than, or equal to, the previously calculated process parameter value multiplied by the first weighting factor switch limit.

5. The method of claim 4, wherein the first value is greater than the second value.

6. The method of claim 4, wherein the first value is less than the second value.

7. The method of claim 1, wherein the process weighting factor comprises a range of 0 to 1.

8. The method of claim 1, wherein the process parameter is a rate of material removal from the wafer for a material removal process.

9. The method of claim 8, wherein the material removal process is a process selected from the group consisting of ion milling process and chemical mechanical planarization process.

10. The method of claim 1, wherein the process parameter is a rate of material deposition for the wafer.

11. The method of claim 1, wherein the calculating the exponential weighted moving average of the process parameter based on the data point (R) and the process weighting factor (lambda) comprises calculating a sum of (lambda multiplied by R) and (1 minus lambda) multiplied by a previously calculated process parameter value.

12. The method of claim 1, further comprising:
selecting a third value for a process weighting factor when the data point is consistent with a third criteria;
wherein the first criteria, the second criteria, and the third criteria are mutually exclusive.

13. The method of claim 12:
wherein the second criteria is a function of the data point, the previously calculated process parameter value, the first weighting factor switch limit, and a second weighting factor switch limit, and
wherein the third criteria is a function of the data point, a previously calculated process parameter value and the first weighting factor switch limit.

14. The method of claim 13:
wherein the first criteria corresponds to whether the data point is greater than the previously calculated process parameter value multiplied by the first weighting factor switch limit,
wherein the second criteria corresponds to whether the data point is both:
less than, or equal to, the previously calculated process parameter value multiplied by the first weighting factor switch limit; and
greater than the previously calculated process parameter value multiplied by the second weighting factor switch limit,
wherein the third criteria corresponds to whether the data point is less than, or equal to, the previously calculated process parameter value multiplied by the second weighting factor switch limit.

* * * * *